(12) United States Patent
Chen et al.

(10) Patent No.: US 10,177,760 B1
(45) Date of Patent: Jan. 8, 2019

(54) CIRCUIT WITH IMPEDANCE ELEMENTS CONNECTED TO SOURCES AND DRAINS OF PMOSFET HEADERS

(71) Applicant: ARM Limited, Cambridge (GB)

(72) Inventors: Andy Wangkun Chen, Austin, TX (US); Yew Keong Chong, Austin, TX (US); Yicong Li, Austin, TX (US); Hsin-Yu Chen, Austin, TX (US); Sriram Thyagarajan, Austin, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/636,428

(22) Filed: Jun. 28, 2017

(51) Int. Cl.
| | |
|---|---|
| *G11C 5/06* | (2006.01) |
| *H03K 17/687* | (2006.01) |
| *G11C 5/14* | (2006.01) |
| *H01L 23/64* | (2006.01) |
| *G11C 7/10* | (2006.01) |
| *G06F 17/50* | (2006.01) |
| *G11C 8/08* | (2006.01) |

(52) U.S. Cl.
CPC ..... *H03K 17/6871* (2013.01); *G06F 17/5072* (2013.01); *G11C 5/14* (2013.01); *G11C 7/10* (2013.01); *G11C 8/08* (2013.01); *H01L 23/647* (2013.01)

(58) Field of Classification Search
CPC ............ G11C 13/0004; G11C 13/0007; G11C 13/004; G11C 13/0061; G11C 13/0069; G11C 13/025; G11C 2013/0042; G11C 2013/0054; G11C 2213/35; G11C 2213/82; G11C 23/00
USPC ...... 365/218, 185.16, 185.2, 189.03, 189.09, 365/230.03, 145, 148, 185.01, 185.21, 365/185.33, 189.15, 201
See application file for complete search history.

(56) References Cited

U.S. PATENT DOCUMENTS

2011/0063895 A1* 3/2011 Komatsu .................. G11C 5/06
                                                            365/156

* cited by examiner

*Primary Examiner* — Thong Q Le
(74) *Attorney, Agent, or Firm* — Pramudji Law Group PLLC; Ari Pramudji

(57) ABSTRACT

A method to generate a circuit instance to include a plurality of pMOSFET instances, where each pMOSFET instance has a source terminal instance connected to one or more supply rail instances. The circuit instance includes impedance element instances, where each impedance element instance is connected to a source terminal instance and a drain terminal instance of a corresponding pMOSFET instance. Depending upon a set of requirements, one or more of the impedance element instances are in a high impedance state or a low impedance state.

20 Claims, 9 Drawing Sheets

CIRCUIT WITH IMPEDANCE ELEMENTS CONNECTED TO SOURCES AND DRAINS OF PMOSFET HEADERS

BACKGROUND

To reduce power consumption, a circuit may employ header pMOSFETs (Metal Oxide Semiconductor Field Effect Transistor) in power gating modules, whereby power may be reduced to various sub-blocks of the circuit when not in operation. However, there may be unwanted IR (current-resistance product) voltage drops across the header pMOSFETs when various driven sub-blocks are dynamically switching on and off.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit implementations of various techniques described herein.

DESCRIPTION OF IMPLEMENTATIONS

In the description that follows, the scope of the term "some implementations" is not to be so limited as to mean more than one implementation, but rather, the scope may include one implementation, more than one implementation, or perhaps all implementations.

Implementations described herein include pMOSFETs in an integrated circuit that may be configured as header pMOSFETs for power gating or as decoupling pMOSFETs to mitigate IR voltage drops.

Figure 1:
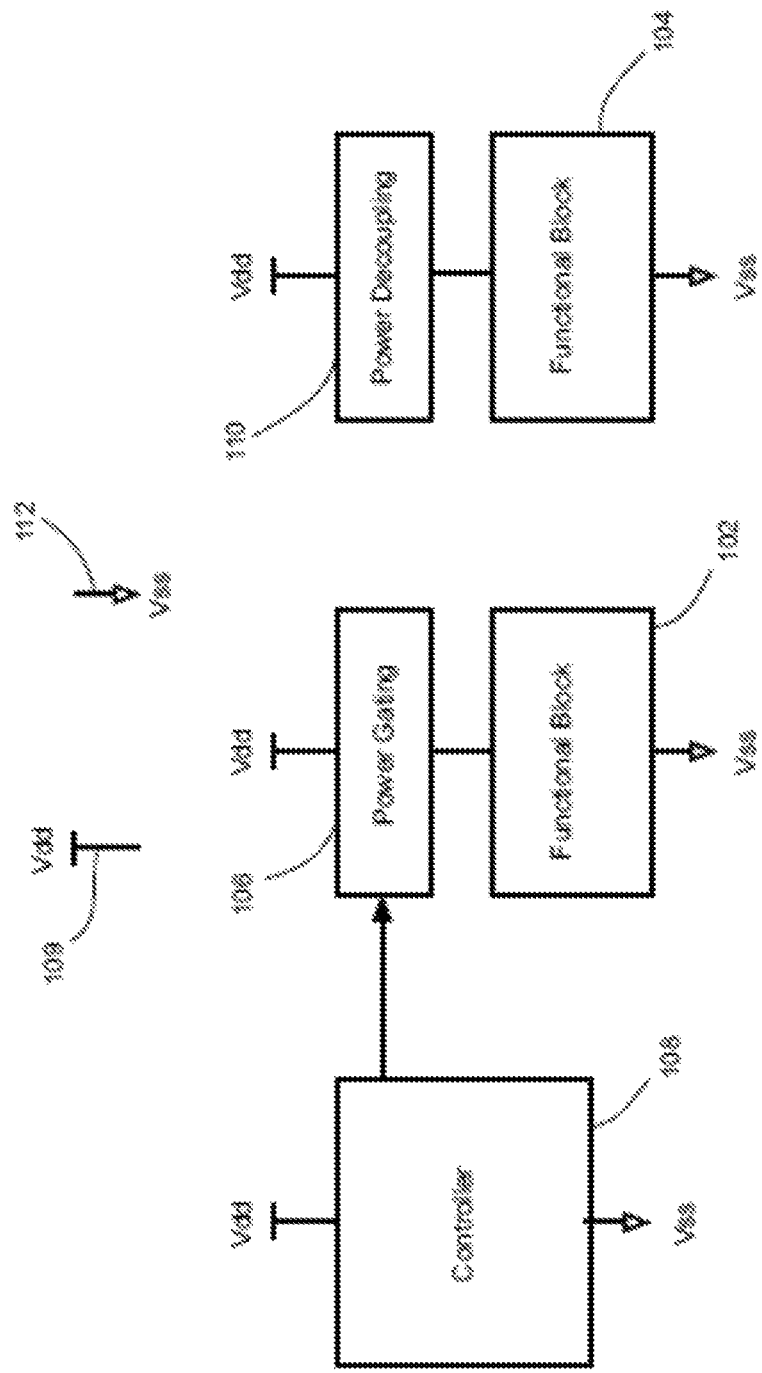
FIG. 1 illustrates a circuit with power gating and power decoupling in accordance with various implementations described herein.

FIG. 1 illustrates a circuit 100 according to an implementation, where the circuit 100 may be integrated on a single chip or on multiple chips. For ease of illustration only several functional units are shown, where power gating is applied to a functional block 102, and where no power gating is applied to a functional block 104. In some implementations, there may be no functional blocks for which power gating is applied, and in other implementations, all or most of the functional blocks may be powered gated.

A power gating module 106 includes one or more header switches to implement power gating to the functional block 102. In practice, a header switch may comprise one or more pMOSFETs, and will be referred to as a header pMOSFET. A controller 108 provides one or more control signals to the power gating module 106. The one or more control signals may be gate voltage signals applied to the gate terminals of various header pMOSFETs within the power gating module 106.

A supply rail 109 provides power to various modules illustrated in FIG. 1. The voltage of the supply rail 109 is denoted as Vdd. When power gating is being applied to the functional block 102, the controller 108 provides one or more control signals to turn OFF header pMOSFETs in the power gating module 106. The functional block 102 is effectively decoupled from the supply rail 109 when in a power gating mode so that power dissipation is significantly reduced.

A power decoupling module 110 includes one or more pMOSFETs configured as decoupling capacitors, where a decoupling capacitor can be referred to as a decoupling pMOSFET. The decoupling pMOSFETs in the power decoupling module 110 are connected between the functional block 104 and the supply rail 109, and mitigate voltage drop in the supply voltage provided to the functional block 104, where a voltage drop may be incurred as various transistors in the functional block 104 switch from OFF to ON during normal operation.

When a decoupling pMOSFET is configured as a decoupling capacitor, the pMOSFET has its gate terminal held at a logic voltage level LOW, which in practice can be at or near a ground or substrate voltage, denoted as Vss and labeled 112 in FIG. 1. In some implementations, the controller 108 may be configured to provide a LOW voltage level to various gate terminals of the decoupling pMOSFETs in the power decoupling module 110. In other implementations, the gate terminals of the decoupling pMOSFETs may be connected directly to the ground or substrate 112. The one or more decoupling pMOSFETs in the power decoupling module 110 can be structurally equivalent to the one or more header pMOSFETs in the power gating module 106.

Figure 2:
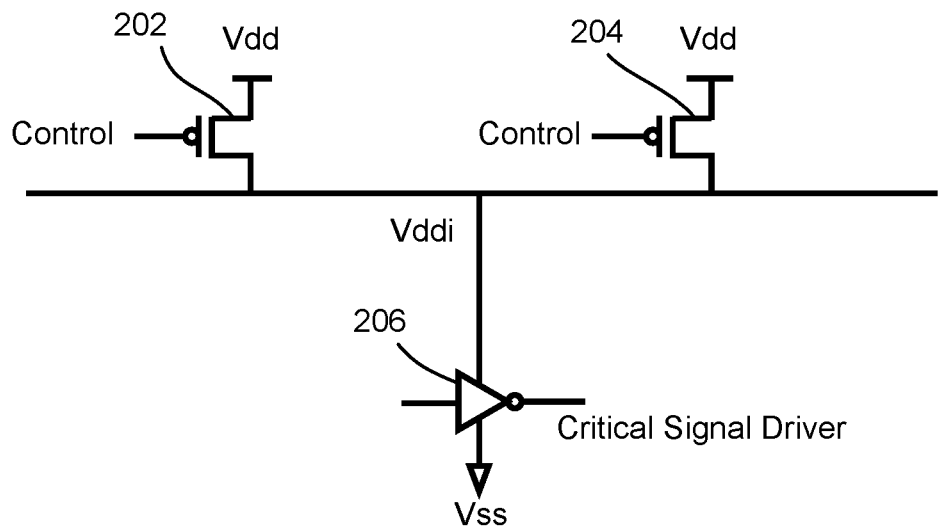
FIG. 2 illustrates a power gating module in accordance with various implementations described herein.

FIG. 2 illustrates an implementation of one or more header pMOSFETs for the power gating module 106. For ease of illustration, only two header pMOSFETs are shown, labeled 202 and 204. The gate terminals of the header pMOSFETs are controlled by the control signal provided by the controller 108. The voltage provided at the source terminals of the header pMOSFETs 202 and 204 is labeled Vddi. The voltage Vddi is an internal supply voltage supplied to various circuit blocks, and it may be less than the supply voltage Vdd due to a voltage drop from the source terminals to the drain terminals of the header pMOSFETs 202 and 204. In FIG. 2, a driver 206, which may be a critical signal driver, represents some of the various circuits receiving the internal supply voltage Vddi.

Figure 3:
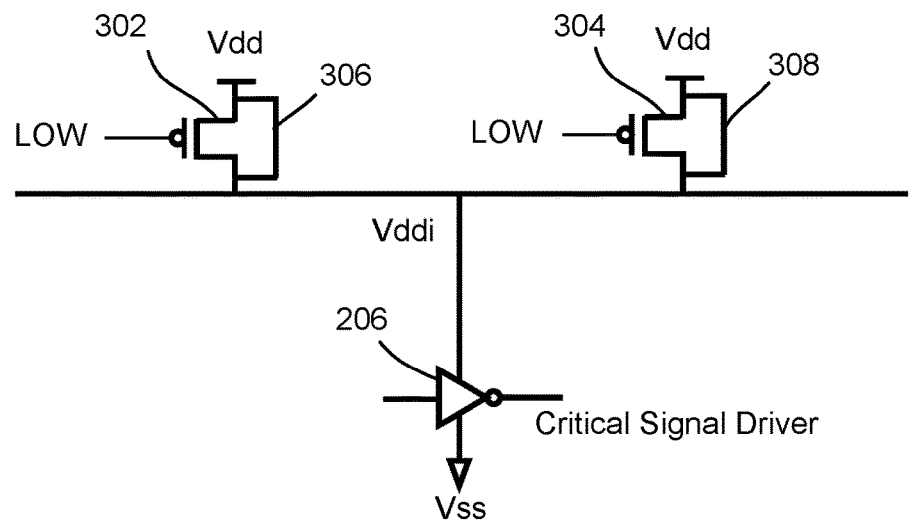
FIG. 3 illustrates a power decoupling module in accordance with various implementations described herein.

FIG. 3 illustrates an implementation of one or more decoupling pMOSFETs for the power decoupling module 110. For ease of illustration, only two decoupling pMOSFETs are shown, labeled 302 and 304. The decoupling pMOSFETs 302 and 304 may be fabricated with the same design parameters as the header pMOSFETs 202 and 204. The gate terminals of the decoupling pMOSFETs are held at a LOW logic level, where the LOW voltage is nominally the ground or substrate voltage Vss.

The source terminal of a decoupling pMOSFET is connected (or shorted) to its drain terminal. The connection may be implemented as a metal interconnect in a metal layer or a polysilicon diffusion. In FIG. 3, the labels 306 and 308 indicate such interconnects. When implementing a design procedure, the decoupling pMOSFETs 302 and 308 may be designed in the same way as the header pMOSFETs 202 and 204, but where additional connections are introduced between source terminals and their respective drain terminals.

Figure 4:
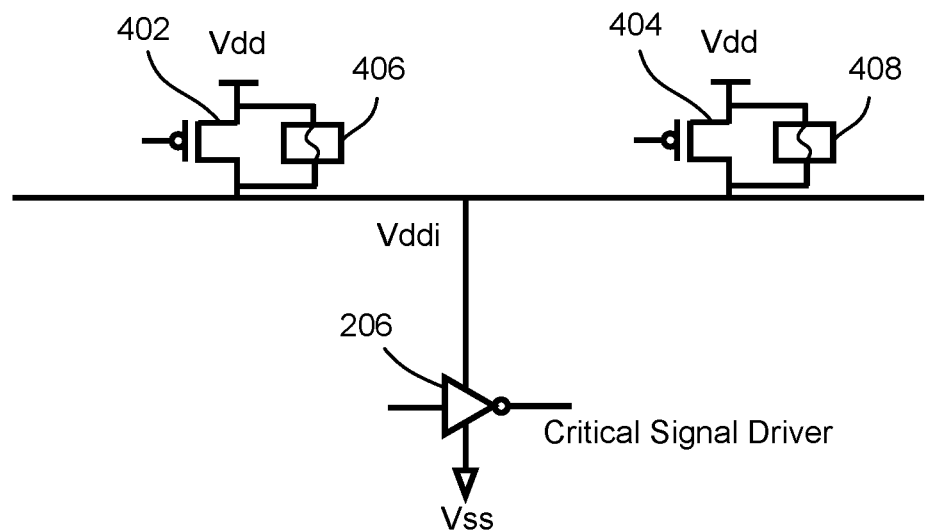
FIG. 4 illustrates a power gating module or power decoupling module in accordance with various implementations described herein.

FIG. 4 illustrates another implementation of one or more pMOSFETs for either the power gating module 106 or the power decoupling module 110, where for ease of illustration only two pMOSFETs are shown, labeled 402 and 404. In the implementation illustrated in FIG. 3, associated with the pMOSFET 402 is a fuse element 406 connected to the source terminal and the drain terminal of the pMOSFET 402. Similarly, a fuse element 408 is connected to the source terminal and the drain terminal of the pMOSFET 404.

In the implementation of FIG. 4, the state of the fuse elements 406 and 408 determine whether the pMOSFETs 402 and 408 are configured as header pMOSFETs for the power gating module 106 or as decoupling pMOSFETs for the power decoupling module 110. As used in this description, a fuse element may be a fuse or an antifuse. When a pMOSFET is configured as a header pMOSFET, its corresponding fuse element is put into a high impedance state so that the source and drain terminals of the pMOSFET are not connected to each other. When a pMOSFET is configured as a decoupling pMOSFET, its corresponding fuse element is put into a low impedance state so that the source and drain terminals of the pMOSFET are connected to each other. When a pMOSFET is configured as a header pMOSFET, the controller provides a control signal to its gate terminal, whereas when a pMOSFET is configured as a decoupling pMOSFET, its gate terminal is held LOW.

In the case where the fuse element is a fuse, the fuse is put into a high impedance state by blowing the fuse (open circuit), whereas in the case of an antifuse the fuse element is initially in a high impedance state. As an example, the fuse element 406 comprises metallization where a laser is used to cut away a portion of the metallization to create an open circuit.

Figure 5:
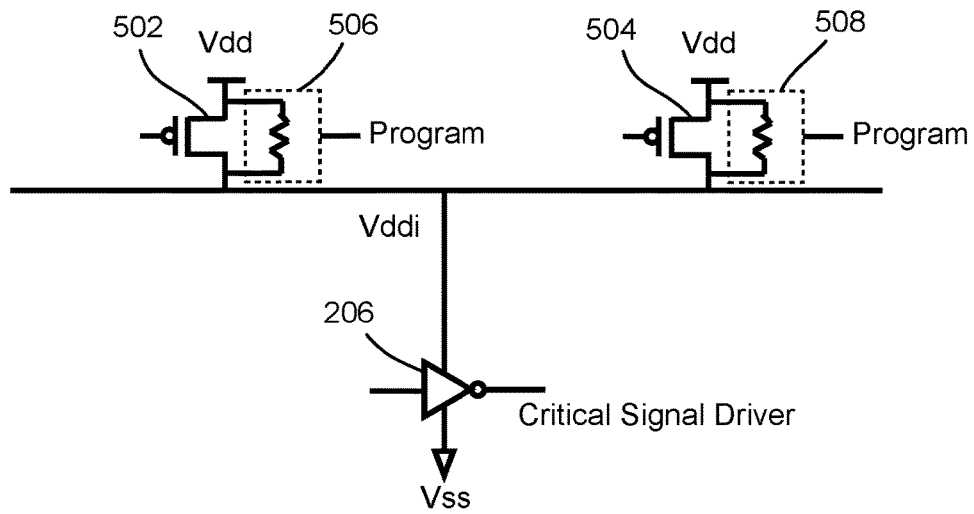
FIG. 5 illustrates a power gating module or power decoupling module in accordance with various implementations described herein.

FIG. 5 illustrates another implementation of one or more pMOSFETs for either the power gating module 106 or the power decoupling module 110, where for ease of illustration only two pMOSFETs are shown, labeled 502 and 504. In the implementation illustrated in FIG. 5, associated with the pMOSFET 502 is a programmable impedance element 506 connected to the source terminal and the drain terminal of the pMOSFET 502. Similarly, a programmable impedance element 508 is connected to the source terminal and the drain terminal of the pMOSFET 504.

The state of the programmable impedance elements for the implementation illustrated in FIG. 5 determine whether the pMOSFETs 502 and 504 are configured as header pMOSFETs or decoupling pMOSFETs. A programming signal can be provided to the programmable impedance elements to program their states, where the pMOSFETs are configured as header pMOSFETs when the programmable impedance elements are in a high impedance state, and the pMOSFETs are configured as decoupling pMOSFETs when the programmable impedance elements are in a low impedance state.

Figure 6:
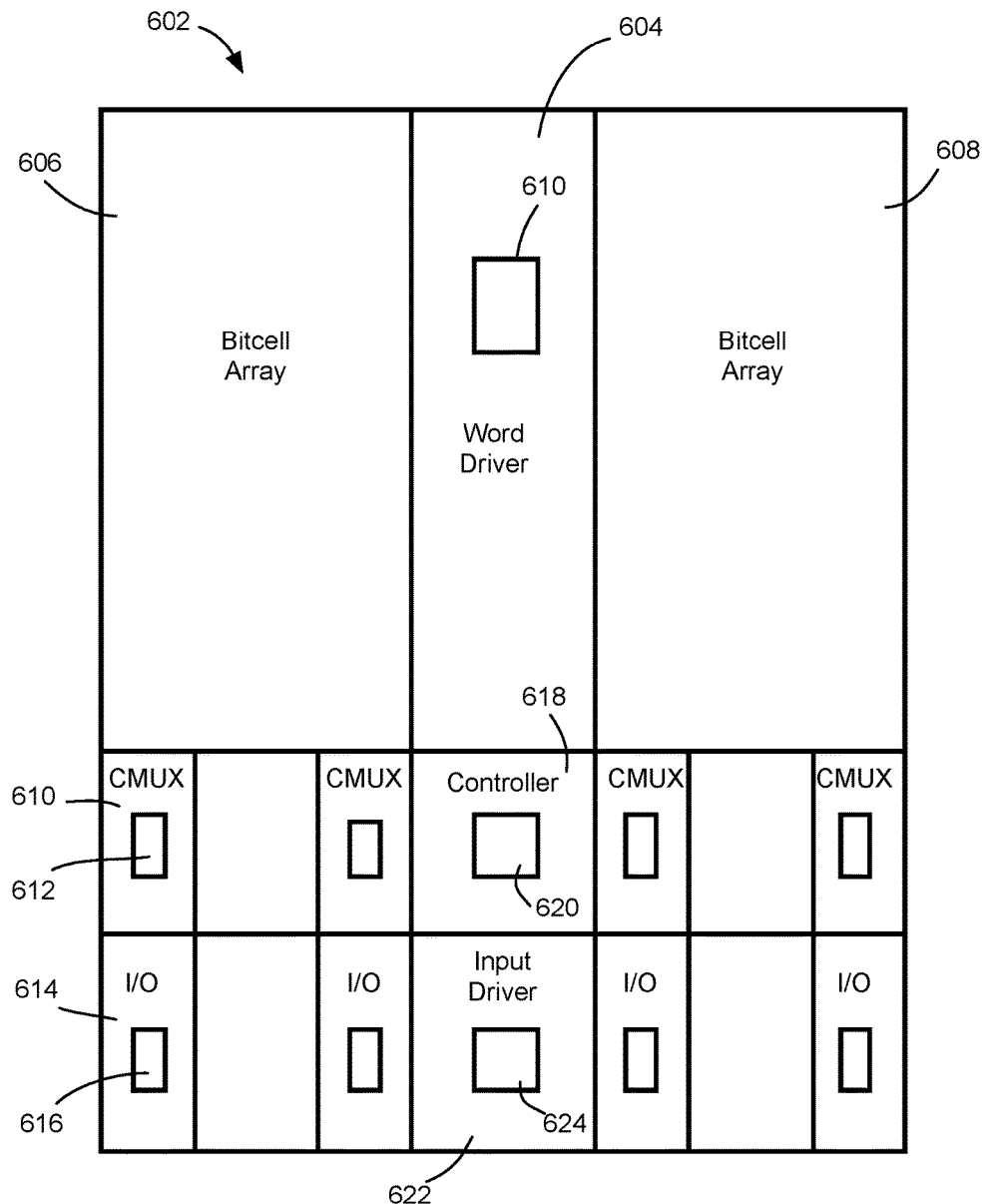
FIG. 6 illustrates a memory circuit in accordance with various implementations described herein.

The header and decoupling pMOSFETs described in the implementations may be located in various sub-blocks of a memory circuit as illustrated in FIG. 6, where for ease of illustration not all sub-blocks typically found in a memory circuit are shown. In a memory circuit 602, a word driver 604 for bitcell arrays 606 and 608 includes one or more pMOSFETs 610, where the one or more pMOSFETs 610 may be configured as header pMOSFETs or decoupling pMOSFETs as discussed with respect to the previously described implementations. One or more pMOSFETs may be used as header pMOSFETs or decoupling pMOSFETs in column muxes, as illustrated for example with column mux 610 and one or more pMOSFETs 612. Input/output (I/O) circuits may employ header or decoupling pMOSFETs, such as for example I/O circuit 614 with one or more pMOSFETs 616. A controller circuit 618 for the memory circuit 602 may also include one or more pMOSFETs 620 that can be configured as either header pMOSFETs or decoupling pMOSFETs, and an input driver circuit 622 may also include one or more pMOSFETs 622 that can be configured as either header pMOSFETs or decoupling pMOSFETs.

It should be appreciated that the implementation illustrated in FIG. 2 is a circuit representation of pMOSFETs that have been configured as header pMOSFETs. That is, the implementation of FIG. 2 may be viewed as a circuit equivalent to the implementations of FIG. 4 or FIG. 5 in which states of the fuse elements or programmable impedance elements are set so that the various pMOSFETs are configured as header pMOSFETs. Likewise, the implementation illustrated in FIG. 3 is a circuit representation of pMOSFETs that have been configured as decoupling pMOSFETs. That is, the implementation of FIG. 3 may be viewed as a circuit equivalent to the implementations of FIG. 4 or FIG. 5 in which states of the fuse elements or programmable impedance elements are set so that the various pMOSFETs are configured as decoupling pMOSFETs.

Furthermore, the implementation illustrated in FIG. 3 may be viewed as an example of the implementation of FIG. 4, where the interconnects 306 and 308 are viewed as fuse elements. In this context, cutting the interconnects 306 and 308 with a laser to configure the pMOSFETs 302 and 304 as header pMOSFETs is comparable to the implementation of FIG. 4 in which the fuse elements 406 and 408 are put into a high impedance state. Not taking any action on the interconnects 306 and 308 configures the pMOSFETs 302 and 304 as decoupling pMOSFETs, comparable to the implementation of FIG. 4 in which the fuse elements 406 and 408 are put into a low impedance state.

Figure 7:
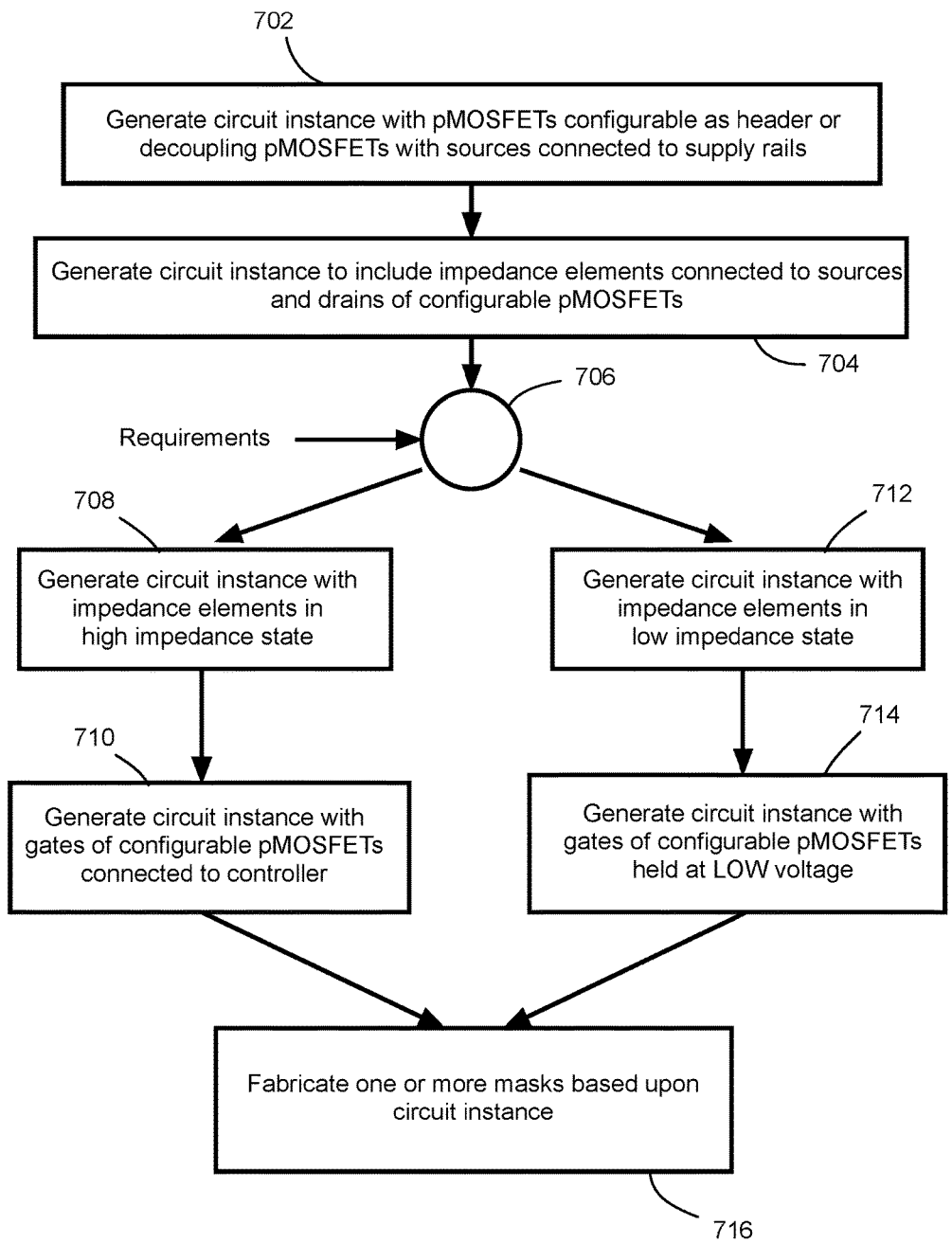
FIG. 7 illustrates a flow diagram for designing and fabricating an integrated circuit in accordance with various implementations described herein.

FIG. 7 is a flow diagram for designing a circuit instance, including fabricating one or more lithography masks according to the circuit instance. It is to be understood that a circuit instance is represented by a data structure, and when referring to a circuit instance, the instantiations of various circuit components, such as for example a pMOSFET, will for ease of discussion be referred to by their standard circuit names without necessarily using the qualifier "instance" or "instantiation" with that name. For example, rather than referring to a pMOSFET instance or an instantiation of a pMOSFET when describing a circuit instance, reference will simply be made to a pMOSFET. It is clear from context that in such cases a reference to a circuit component is a reference to the instantiation of that circuit component.

In step 702, a circuit instance is generated in which a plurality of pMOSFET may be configured as header pMOSFET or decoupling pMOSFETs. The source terminals of the pMOSFET are connected to one or more supply rails. In step 704, the circuit instance is further generated to include impedance elements, where corresponding to each configurable pMOSFET is an impedance element connected to its source terminal and its drain terminal. For example, the fuse element 406 or the programmable resistor 506 are examples of an impedance element.

In step 706, the pMOSFETs are configured as header pMOSFETs or decoupling pMOSFETs, depending upon a set of requirements that may be provided by a customer. For the case in which the pMOSFETs are configured as header pMOSFETs, in step 708 the impedance elements are configured to be in a high impedance state, and in step 710 the pMOSFETs are configured so that their gate terminals are connected to a controller, for example the controller 108 of FIG. 1.

For the case in which the pMOSFETs are configured as decoupling pMOSFETs, in step 712 the impedance elements are configured to be in a low impedance state. Furthermore, in step 714 the pMOSFETs are configured so that their gate terminals are connected to a LOW voltage, meaning that when the circuit is in operation, a voltage having the logic level LOW is provided to the gate terminals.

In step 716, one or more lithography masks based upon the generated circuit instance are fabricated so that a wafer make be fabricated with circuits according to the circuit instance.

Figure 8:
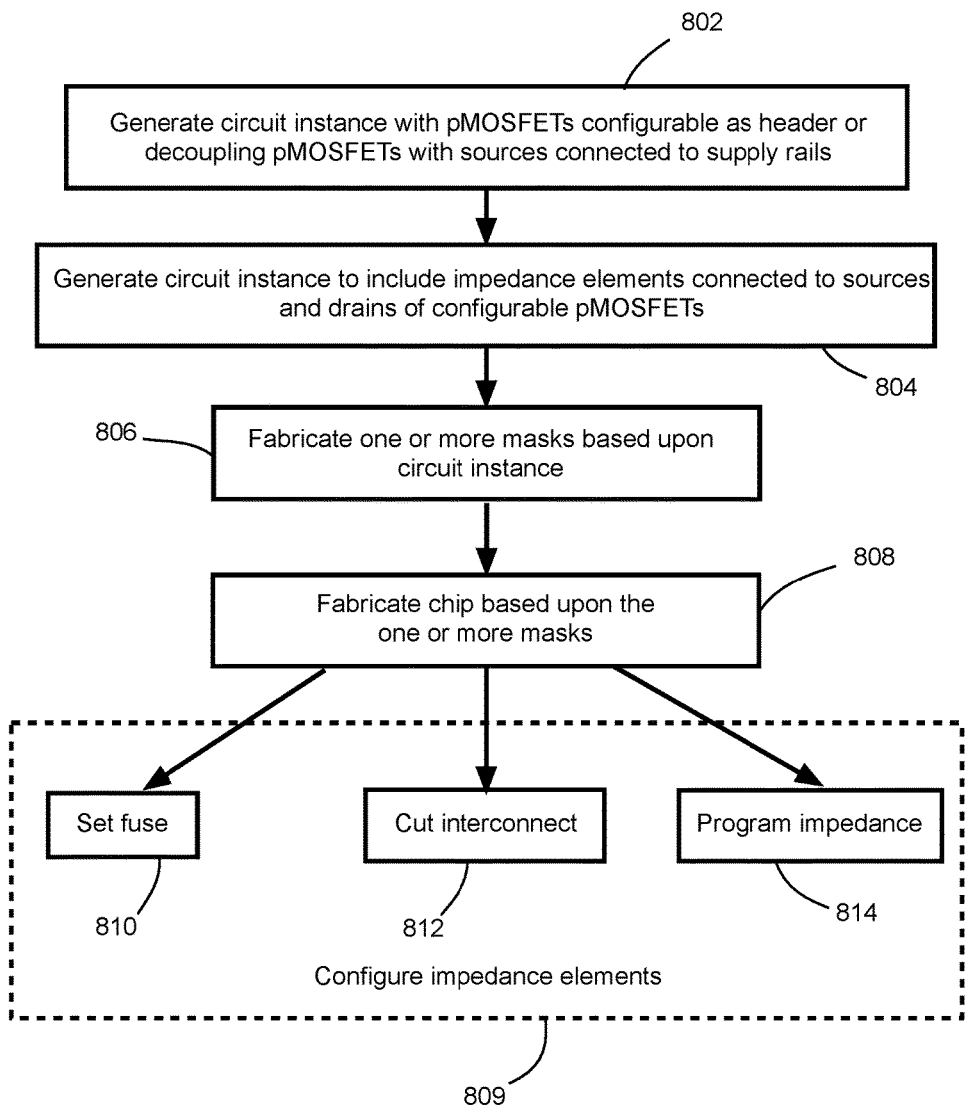
FIG. 8 illustrates a flow diagram for designing and fabricating an integrated circuit in accordance with various implementations described herein.

FIG. 8 is a flow diagram for designing a circuit instance, including fabricating one or more lithography masks according to the circuit instance, and further including additional steps to configure pMOSFETs as header pMOSFETs or decoupling pMOSFETs. In step 802, a circuit instance is generated with configurable pMOSFETs with their source terminals connected to one or more supply rails. In step 804, the circuit instance is further generated to include impedance elements, where corresponding to each configurable pMOSFET is an impedance element connected to its source terminal and its drain terminal. In step 806, one or more masks are fabricated according to the circuit instance, and in step 808 a wafer (or chip) is fabricated based upon the one or more masks.

Upon fabrication of the integrated circuit, various steps may be taken depending upon the type of impedance elements and whether the customer desires the pMOSFETs to be configured as header pMOSFETs or decoupling pMOSFETs. This is represented by step 809, where the impedance elements may be configured in several ways indicated by steps 810, 812, and 814. In step 810, the impedance elements may be fuse elements, where the state of the fuse elements are set according to a set of requirements, such as customer requirements. For example, as discussed previously, a fuse element may be set to a high impedance state if its corresponding pMOSFET is to be configured as a header pMOSFET, and the fuse element may be set to a low impedance state if its corresponding pMOSFET is to be configured as a decoupling pMOSFET.

In step 812, the impedance elements may be interconnects, in which case those interconnects for which their corresponding pMOSFETs are to be configured as header pMOSFETs are cut. In step 814, the impedance elements are programmable resistors, and a programmable resistor is programmed to be either in a high impedance or low impedance state so that its corresponding pMOSFET is configured as a header pMOSFET or decoupling pMOSFET, respectively.

In some implementations, all configurable pMOSFETs fabricated according to the steps 702 and 704 or the steps 802 and 804 may be configured as either header pMOSFET or decoupling pMOSFETs. Other implementations may be such that the pMOSFETs in an integrated circuit, fabricated according to the steps 702 and 704 or the steps 802 and 804, may be configured so that some of the pMOSFETs are configured as header pMOSFETs and some of the pMOSFETs are configured as decoupling pMOSFETs.

Figure 9:
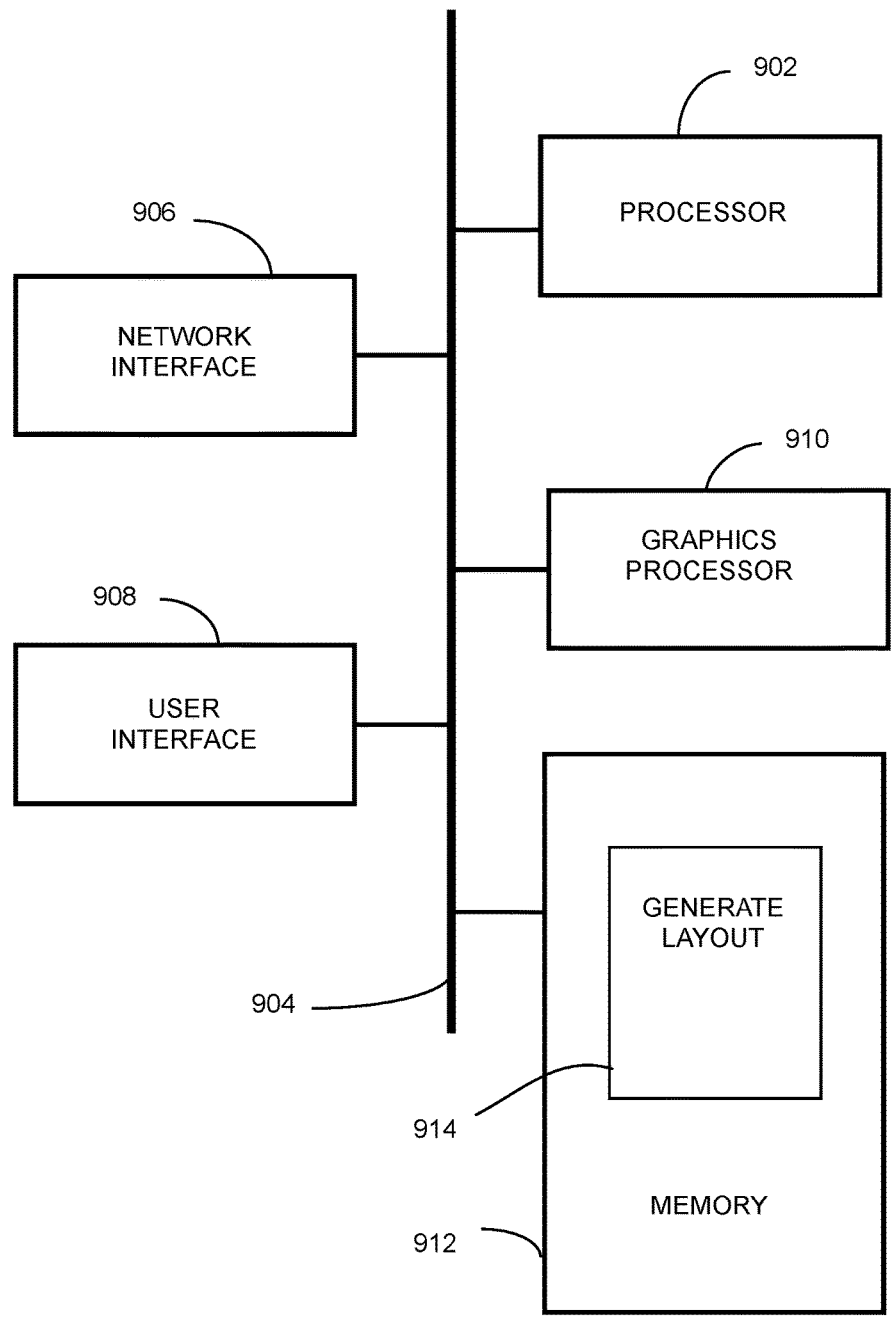
FIG. 9 illustrates a computing platform for implementing a method in accordance with various implementations described herein.

Many of the steps illustrated in the flow diagrams of FIGS. 7 and 8 for generating circuit instances and files for masks may be performed by a programmable computing platform such as that illustrated in FIG. 9. FIG. 9 illustrates a processor 902 coupled by way of an interconnect or bus 904 to various other functional units, such as a network interface 906, a user interface 908, a graphics processor 910, and a system memory 912. The processor 902 represents one or more processors, were each processor comprises one or more processor cores. The system memory 912 may be part of a memory hierarchy, or some components of the memory hierarchy may be embedded on the same chip as the processor 902. Module 914 illustrates instructions stored in the memory 912 that when executed by the processor 902 cause the programmable computing platform of FIG. 9 to generate a circuit instance (layout) as described with respect to the processes of FIG. 7 or 8.

Implementations of various technologies described herein may be operational with numerous general purpose or special purpose computing system environments or configurations. Examples of computing systems, environments, and/or configurations that may be suitable for use with the various technologies described herein include, but are not limited to, personal computers, server computers, hand-held or laptop devices, multiprocessor systems, microprocessor-based systems, set top boxes, programmable consumer electronics, network PCs, minicomputers, mainframe computers, smart phones, tablets, wearable computers, cloud computing systems, virtual computers, marine electronics devices, and the like.

The various technologies described herein may be implemented in the general context of computer-executable instructions, such as program modules, being executed by a computer. Program modules include routines, programs, objects, components, data structures, etc. that perform particular tasks or implement particular abstract data types. Further, each program module may be implemented in its own way, and all need not be implemented the same way. While program modules may execute on a single computing system, it should be appreciated that, in some implementations, program modules may be implemented on separate computing systems or devices adapted to communicate with one another. A program module may also be some combination of hardware and software where particular tasks performed by the program module may be done either through hardware, software, or some combination of both.

The various technologies described herein may be implemented in distributed computing environments where tasks are performed by remote processing devices that are linked through a communications network, e.g., by hardwired links, wireless links, or various combinations thereof. In a distributed computing environment, program modules may be located in both local and remote computer storage media including, for example, memory storage devices and similar.

Further, the discussion provided herein may be considered directed to certain specific implementations. It should be understood that the discussion provided herein is provided for the purpose of enabling a person with ordinary skill in the art to make and use any subject matter defined herein by the subject matter of the claims. It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Described herein are various implementations of a method comprising: generating a circuit instance to include a plurality of pMOSFET instances, wherein each pMOSFET instance has a source terminal instance connected to one or more supply rail instances; generating the circuit instance to include impedance element instances, wherein each impedance element instance is connected to a source terminal instance and a drain terminal instance of a corresponding pMOSFET instance; depending upon a set of requirements, generating the circuit instance to indicate that one or more of the impedance element instances are in a high impedance state or a low impedance state; and fabricating one or more masks according to the generated circuit instance.

Described herein are various implementations of a method comprising: generating a circuit instance to include a plurality of pMOSFET instances, where each pMOSFET instance has a source terminal instance connected to one or more supply rail instances; generating the circuit instance to include impedance element instances, where each impedance element instance is connected to a source terminal instance and a drain terminal instance of a corresponding pMOSFET instance; fabricating one or more masks according to the generated circuit instance; fabricating an integrated circuit based upon the one or more masks, the integrated circuit comprising pMOSFETs according to the pMOSFET instances and impedance elements according to the impedance element instances; and after fabricating the integrated circuit, configuring each impedance element to have a high impedance or a low impedance.

Described herein are various implementations of a memory circuit comprising: one or more supply rails; a word driver; a plurality of input/output circuits; a plurality of column muxes; a plurality of pMOSFETs, each pMOSFET in the plurality of pMOSFETs having a source terminal connected to at least one of the one or more supply rails, a gate terminal, and a drain terminal coupled to the word driver, an input/output circuit, or a column mux; a plurality of impedance elements, each impedance element connected to a source terminal and a drain terminal of a corresponding pMOSFET in the plurality of pMOSFETs, wherein each impedance element is configurable to have a low impedance or a high impedance; and a controller to provide a control voltage, wherein each pMOSFET in the plurality of pMOSFETs is configurable to have its gate terminal connected to the controller or held at a LOW voltage when the circuit is in operation.

Reference has been made in detail to various implementations, examples of which are illustrated in the accompanying drawings and figures. Numerous specific details are set forth to provide a thorough understanding of the disclosure provided herein. However, the disclosure provided herein may be practiced without these specific details. In some other instances, well-known methods, procedures, components, circuits, and networks have not been described in detail so as not to unnecessarily obscure details of the implementations.

If one or more circuits are used to realize some or all instances of an implementation, reference may be made to a node or terminal of a circuit or circuit element as an input port or an output port. For a circuit in which a port is a two terminal structure (e.g., circuits modeled as lumped-parameter systems), a recited node or terminal forms one terminal of the two terminal structure, where it is understood that a ground rail (or substrate) serves as another terminal of the two terminal structure.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described herein are disclosed as example forms of implementing the claims.

What is claimed is:

1. A method comprising:
   generating a circuit instance to include a plurality of pMOSFET instances, wherein each pMOSFET instance has a source terminal instance connected to one or more supply rail instances;
generating the circuit instance to include impedance element instances, wherein each impedance element instance is connected to a source terminal instance and a drain terminal instance of a corresponding pMOSFET instance;
depending upon a set of requirements, generating the circuit instance to indicate that one or more of the impedance element instances are in a high impedance state or a low impedance state; and
fabricating one or more masks according to the generated circuit instance.

2. The method as set forth in claim 1, further comprising:
generating the circuit instance to include a controller instance coupled to gate terminals of those pMOSFET instances for which their corresponding impedance element instances are in a high impedance state; and
generating the circuit instance to indicate a LOW voltage on gate terminals of those pMOSFET instances for which their corresponding impedance element instances are in a low impedance state.

3. The method as set forth in claim 2, wherein the circuit instance includes a memory instance.

4. The method as set forth in claim 3, wherein the memory instance includes a word driver instance, wherein connected to the word driver instance is at least one of the pMOSFET instances.

5. The method as set forth in claim 3, wherein the memory instance includes a plurality of column mux instances, where connected to each column mux instance is at least one of the pMOSFET instances.

6. The method as set forth in claim 3, wherein the memory instance includes a plurality of input/output instances, wherein connected to each input/output instance is at least one of the pMOSFET instances.

7. The method as set forth in claim 1, wherein all of the impedance element instances are indicated to either have a high impedance or a low impedance.

8. The method as set forth in claim 1, wherein at least one of the impedance element instance is a fuse element instance.

9. The method as set forth in claim 1, wherein at least one of the impedance element instance is an interconnect instance.

10. The method as set forth in claim 1, wherein at least one of the impedance element instance is a programmable resistor instance.

11. The method as set forth in claim 1, wherein the circuit instance is represented by a data structure stored in a computer memory.

12. A method comprising:
generating a circuit instance to include a plurality of pMOSFET instances, where each pMOSFET instance has a source terminal instance connected to one or more supply rail instances;
generating the circuit instance to include impedance element instances, where each impedance element instance is connected to a source terminal instance and a drain terminal instance of a corresponding pMOSFET instance;
fabricating one or more masks according to the generated circuit instance;
fabricating an integrated circuit based upon the one or more masks, the integrated circuit comprising pMOSFETs according to the pMOSFET instances and impedance elements according to the impedance element instances; and
after fabricating the integrated circuit, configuring each impedance element to have a high impedance or a low impedance.

13. The method as set forth in claim 12, wherein in fabricating the integrated circuit, a controller is coupled to gate terminals of those pMOSFETs for which their corresponding impedance elements are in a high impedance state, and wherein a LOW voltage is provided to gate terminals of those pMOSFETs for which their corresponding impedance elements are in a low impedance state.

14. The method as set forth in claim 12, wherein the integrated circuit includes a memory circuit.

15. The method as set forth in claim 14, wherein the memory circuit includes a word driver, wherein connected to the word driver is at least one of the pMOSFETs.

16. The method as set forth in claim 14
wherein the memory circuit includes a plurality of column muxes, where connected to each column mux is at least one of the pMOSFETs; and
wherein the memory instance includes a plurality of input/output circuits, wherein connected to each input/output circuit is at least one of the pMOSFETs.

17. The method as set forth in claim 12, wherein each impedance element is an interconnect, the method further comprising:
after fabricating the integrated circuit, cutting each interconnect.

18. The method as set forth in claim 12, wherein each impedance element is a fuse element, the method further comprising:
after fabricating the integrated circuit, setting each fuse element to a low impedance or a high impedance.

19. The method as set forth in claim 12, wherein each impedance element is a programmable resistor, the method further comprising:
after fabricating the integrated circuit, programming each programmable resistor to a low impedance or a high impedance.

20. A memory circuit comprising:
one or more supply rails;
a word driver;
a plurality of input/output circuits;
a plurality of column muxes;
a plurality of pMOSFETs, each pMOSFET in the plurality of pMOSFETs having a source terminal connected to at least one of the one or more supply rails, a gate terminal, and a drain terminal coupled to the word driver, an input/output circuit, or a column mux;
a plurality of impedance elements, each impedance element connected to a source terminal and a drain terminal of a corresponding pMOSFET in the plurality of pMOSFETs, wherein each impedance element is configurable to have a low impedance or a high impedance; and
a controller to provide a control voltage, wherein each pMOSFET in the plurality of pMOSFETs is configurable to have its gate terminal connected to the controller or held at a LOW voltage when the circuit is in operation.

* * * * *